United States Patent [19]

Letize et al.

[11] Patent Number: 5,648,200
[45] Date of Patent: Jul. 15, 1997

[54] PROCESS FOR CREATING CIRCUITRY ON THE SURFACE OF A PHOTOIMAGEABLE DIELECTRIC

[75] Inventors: Raymond Letize, West Haven; Peter Kukanskis, Woodbury, both of Conn.

[73] Assignee: MacDermid, Incorporated, Waterbury, Conn.

[21] Appl. No.: 726,546

[22] Filed: Oct. 7, 1996

Related U.S. Application Data

[63] Continuation of Ser. No. 410,031, Mar. 22, 1995, abandoned.

[51] Int. Cl.$^6$ ....................................................... G03F 7/00
[52] U.S. Cl. ........................... 430/315; 430/311; 430/313
[58] Field of Search ..................................... 430/311, 313, 430/314, 315, 318

[56] References Cited

U.S. PATENT DOCUMENTS

| | | | |
|---|---|---|---|
| 4,265,943 | 5/1981 | Goldstein et al. | 427/305 |
| 4,325,990 | 4/1982 | Fenier | 427/305 |
| 4,847,114 | 7/1989 | Brasch | 427/96 |
| 4,863,758 | 9/1989 | Rhodeniger | 427/97 |
| 4,897,118 | 1/1990 | Ferrier | 106/1.11 |
| 4,976,990 | 12/1990 | Bach et al. | 427/98 |
| 5,059,243 | 10/1991 | Jagannathan | 106/1.26 |
| 5,246,817 | 9/1993 | Shipley, Jr. | 430/312 |
| 5,322,976 | 6/1994 | Knudsen et al. | 174/262 |

*Primary Examiner*—Kathleen Duda
*Attorney, Agent, or Firm*—John L. Cordani

[57] ABSTRACT

A process is proposed for creating circuitry on the surface of a photoimageable dielectric. Specifically the process uses electroless means with controlled pH and an organosilane conditioning agent to fabricate circuitry and interconnects directly upon the surface of a photoimageable dielectric, such circuitry and interconnects having good adhesion to and coverage of the dielectric surface.

14 Claims, No Drawings

PROCESS FOR CREATING CIRCUITRY ON THE SURFACE OF A PHOTOIMAGEABLE DIELECTRIC

This application is a continuation of application Ser. No. 07/410,031, filed Mar. 22, 1995, now abandoned.

FIELD OF INVENTION

This process relates to a process for creating circuitry on the surface of a photoimageable dielectric. Specifically, the proposed process uses electroless means to fabricate circuitry and interconnects directly upon the surface of a photoimageable dielectric, such circuitry and interconnects having good adhesion to and coverage of the dielectric surface.

BACKGROUND

In general, there are three commonly used methods for manufacturing printed circuit boards. The methods are broadly termed subtractive, fully additive and semi-additive. The characteristics of each of these processing methods is amply discussed in U.S. Pat. No. 4,847,114 (Brasch et al.), the teachings of which are incorporated herein by reference in their entirety.

Improvements in these general processes are widespread. One avenue that improvements have concentrated is that of minaturization. Various modifications to the general processes indicated above have been introduced in order to enable the creation of more circuitry and interconnects per unit of surface area.

One such improvement is described in U.S. Pat. No. 5,246,817 (Shipley, Jr.), the teachings of which are incorporated herein by reference in their entirety. Shipley, Jr. discusses a process for the formation of multilayer circuit boards where layers are formed sequentially using selective plating techniques and imaging of dielectric materials to achieve fine line resolution and interconnections between circuits, thereby permitting multilayers of higher density using imaging techniques.

Thus the techniques discussed in Shipley, Jr. involve the deposition of electroless copper onto the surface of the imaged dielectric material. In fact Shipley, Jr. specifically discusses the use of electroless copper solutions to achieve metallization of the imaged dielectric at column 14, lines 10 to 23. The electroless copper solutions referred to in Shipley, Jr. are typical electroless copper solutions, preferably with the ability to plate ductile copper, capable of withstanding a solder shock test of about 260° C. for 10 seconds without cracking.

Several problems have been experienced in practicing the methods discussed in Shipley, Jr. One such problem is in achieving substantial coverage of the imaged dielectric surface with the plated copper. A second difficulty occurs in achieving good functional adhesion of the plated metal to the imaged dielectric surface. These problems are particularly pronounced when the imaged dielectric surface is polyimide, polyetherimide or blends of either of the foregoing resins with each other or with other resins.

SUMMARY OF THE INVENTION

The current invention proposes a process for plating upon a photoimageable dielectric surface whereby substantial coverage of that surface with the plated metal and good, functional, adhesion of the plated metal to the photoimageable dielectric surface is achieved. The proposed process is particularly suited to effective metallization of photoimageable dielectrics comprising polyimide, polyetherimide or blends of either of the foregoing resins with each other or with other resins.

Excellent coverage and adhesion are achievable through the implementation of electroless plating baths with pH's in the range of 3 to 12. In particular, electroless nickel plating baths with pH's in the range of 3 to 12 provide superior performance. In addition, it has been found that use of these plating baths in conjunction with a surface conditioning agent comprising an organosilane provide the optimum in adhesion and coverage.

DETAILED DESCRIPTION OF THE INVENTION

Advanced methods of preparing printed circuit boards, such as those discussed in Shipley, Jr., have necessitated plating upon photoimageable dielectrics. Photoimageable dielectrics differ substantially in many ways from non-photoimageable thermosetting dielectrics. Plating upon these photoimageable dielectrics has proven substantially more difficult than upon non-photoimageable, thermosetting, dielectrics. Particular problems have been experienced in achieving substantial coverage of the plated metal over the surface of the photoimageable dielectric and in achieving good, functional, adhesion of the plated metal to the photoimageable dielectric surface.

The pertinent differences in properties between the photoimageable dielectrics and non-photoimageable thermosetting, dielectrics may arise from the substantial differences in their compositions, and/or from differences in the processing of the dielectric materials. In addition to substantial differences in composition between photoimageable and non-photoimageable dielectrics, photoimageable dielectrics are applied and processed in significantly different ways from their non-photoimageable counterparts. In particular photoimageable dielectrics are applied to the surface, usually in liquid form. The photoimageable dielectrics are then imagewise exposed to radiation of the appropriate wavelength, developed (ie. the unexposed portions of the photoimageable dielectric are selectively dissolved or otherwise removed from the surface with an appropriate solvent) and finally cured. Plating of the photoimageable dielectric occurs sometime after the foregoing processing steps. Non-photoimageable dielectrics are generally not subject to these processing steps. Thus, due to these significant differences, the plating of photoimageable dielectric surfaces has proven different and more difficult than plating their non-photoimageable counterparts. Differences in the surfaces of photoimageable and non-photoimageable dielectric surfaces have caused it to be more difficult to achieve significant coverage and adhesion when plating the photoimageable surfaces.

Thus the current process answers the shortcoming of the art in these areas by proposing a process for plating upon a photoimageable dielectric surface whereby substantial coverage of that surface with the plated metal and good, functional, adhesion of the plated metal to the photoimageable dielectric surface is achieved. These advantages are achieved through the use of electroless plating baths with pH's in the range of 3 to 12, preferably in the range of 4 to 11 and most preferably in the range of 5 to 10. Thus, the inventors have discovered that improved coverage and adhesion are achieved on photoimageable dielectric surfaces when electroless plating bath with pH's in the foregoing ranges are utilized. These pH ranges are not achievable with typical formaldehyde based electroless copper formulations, which universally have pH's in excess of 12.

In particular electroless nickel or cobalt solutions with pH's in the range described above are particularly useful. The inventors have discovered that these nickel and cobalt plating solutions, with the given pH restrictions, provide the most complete coverage and best adhesion achievable on photoimageable dielectric surfaces, and are thus the most preferred. In this regard the teachings of U.S. Pat. No. 5,322,976 issued to Knudsen et al. are incorporated herein by reference in their entirety.

In addition to electroless nickel and cobalt, certain electroless copper solutions, with the given pH constraints, have also proven successful in plating photoimageable dielectric surfaces. Most notably are the non-formaldehyde electroless copper solutions, such as those taught in U.S. Pat. Nos. 4,265,943 and 4,325,990, the teachings both of which are incorporated herein by reference in their entirety, with the said pH constraints.

In addition, the inventors have discovered that photoimageable dielectric surfaces are particularly sensitive to the conditioning agent utilized prior to plating. Whereas acceptable adhesion and coverage of the plating can be achieved on non-photoimageable dielectric surfaces using a variety of conditioning agents ie. cationic surfactants, polyelectrolytes, and organic silanes prior to catalyzation and metallization, unexpected differences and improvements in coverage and adhesion are achieved with the use of organosilane conditioning agents on photoimageable dielectrics. In this regard the teachings of U.S. Pat. No. 4,976,990 issued to Bach et al. are incorporated herein by reference in their entirety.

Although the processes proposed herein are particularly suited to the plating of photoimageable dielectric materials comprising polyimides, polyetherimides and blends of the foregoing resins with each other and with other resins, they seem to produce excellent results on other photoimageable dielectrics such as epoxy, acrylate, and epoxy-acrylate co-polymer based photoimageable dielectrics.

The metallization process of the current invention contemplates the following plating process sequence:

1. Optionally, solvent swell;
2. Optionally, chemical etching of the Photoimageable Dielectric Surface;
3. Optionally, chemical reducer;
4. Conditioner, preferably an organosilane based conditioner;
5. Optionally, copper microetch;
6. Activation;
7. Optionally, acceleration;
8. Electroless metal deposition with an electroless bath having a pH in the range of 3 to 12, preferably an electroless nickel or cobalt bath;
9. Optionally, bake;
10. Optionally, electrolytic metal plating;

Note: Clean water rinses are interposed between chemical processing steps.

The solvent swell and the chemical etching of the surface are well known operations for plastic surfaces. The solvent swell may consist of a variety of known solvents for the particular surface involved, including m-pyrol, butyl carbitol and various glycol's. The chemical etching can be accomplished by various means including the use of oxidizers such as permanganates and chromic acid. A chemical reducer may be used to reduce permanganate or chromic acid residues on the surface. Reducers can be any one or a mixture of appropriate reducing agents such as hydrazine or hydroxylamine sulfate.

The conditioning of the photodefineable dielectric surface has been found to be particularly critical. Organosilanes such as those discussed in U.S. Pat. No. 4,976,990 have been found to give unexpected results in achieving coverage and adhesion over these surfaces. The most preferred conditioners in this regard contain organosilanes of the following formula:

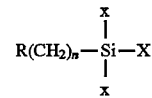

wherein R represents a reactive organic function attached to the silicon atom or to the terminal carbon of the methylene chain bound to the silicon, n represents an integer from 0 to 3, preferably 1 to 3 and wherein X represents a readily hydrolyzable group such as chlorine, methoxy, ethoxy, methoxy—ethoxy and the like. Of particular advantage in this regard is the use of an alkaline conditioning agent comprising gamma—aminopropyl—trimethoxysilane. Particularly good results with regard to coverage and adhesion, especially, are achievable by utilizing a plating process sequence which combines the alkaline organosilane conditioning agent with subsequent electroless plating in a bath with the pH constraints discussed above (ie. pH between 3 and 12, preferably between 4 and 11 and most preferably between 5 and 10). The most preferred plating sequence of this invention comprises both the said alkaline organo silane conditioning agent (preferably comprising gamma-aminopropyl-trimethoxysilane) and an electroless nickel plating solution within said pH ranges.

The activation of the surface may occur by any known method of activating non-conductive surfaces to accept plating thereon. A preferred method of activation is discussed in U.S. Pat. No. 4,863,758 issued to Rhodenizer, the teaching of which are incorporated herein by reference in their entirety. The acceleration step may also consist of a variety of known acceleration methods, however, the most preferred method of acceleration is described in U.S. Pat. No. 4,608,275, the teachings of which are incorporated herein by reference in their entirety.

The plating composition, particularly the pH of the plating composition has been determined to be particularly critical to achieving acceptable plating results. It has been determined that excellent plating results upon the surface of photoimageable dielectric materials are achievable with electroless plating solutions having pH's in a controlled range. The pH of the electroless plating solutions in these cases should be between 3 and 12, preferably between 4 and 11 and most preferably between 5 and 10. These findings are particularly surprising in light of the fact that formaldehyde based electroless copper solutions universally have pH's in excess of 12 and usually in excess of 13. In addition the inventors have discovered that electroless nickel or cobalt solutions, particularly those in the said pH ranges produce unexpectedly good plating results, particularly with regard to coverage and adhesion over photoimageable dielectric surfaces. The most preferred plating solution according to this invention is an ammonium hydroxide based or other mildly alkaline electroless nickel plating solution with a pH in the range of 8.0 to 9.5.

After electroless metallization, the inventors have found that improved results are achievable if the part is baked.

Baking time should range from 15 minutes to 2 hours with the baking temperature ranging from 150° F. to 325° F. Baking may occur in one step or in a series of steps at varying times and temperatures.

Depending upon whether the electroless deposit was applied to the photoimageable dielectric surface in an imagewise manner or whether the entire surface of said dielectric was electrolessly plated, the fabricator can now continue on to fabricate circuits and interconnects in an additive, semi-additive, or subtractive manner as described in U.S. Pat. No. 4,847,114 and/or U.S. Pat. No. 5,246,817. The success of fabricating the circuits and interconnects in these manners will directly depend upon the coverage, adhesion and quality of the electroless base which has been applied. Electroless deposits applied to photoimageable dielectric surfaces in accordance with this invention provide the coverage, adhesion and quality which allow successful fabrication of circuits and interconnects upon such surfaces.

The current invention is further described in the following examples which are meant to describe certain aspects of said invention but are not to be construed as limiting in any way.

EXAMPLE I

Ultradel 7500, a polyimide based photoimageable dielectric material available from Amoco Chemical Company of Naperville, Ill., was screen coated onto the surface of a rigid substrate. The Ultradel material was then exposed to ultraviolet radiation in an imagewise fashion. The unexposed portions of the Ultradel material were selectively developed off the surface by exposing said surface to an appropriate solvent such as m-pyrol. The Ultradel material remaining on the surface was then further cured by baking for 1½ hours at 300° F.

The imaged and cured Ultradel dielectric surface was then subjected to the following plating sequence:

EXAMPLE II

Example I was repeated except that the Ultradel photoimageable dielectric material was changed to MacDermid Macu Mask 6000 which is an epoxy-acrylate based photoimageable dielectric, and the solvent swellant was changed to MacDermid 9204 at 100% by volume in step 1 of the plating sequence.

The plating resulted in complete coverage of the surface by the electroless nickel deposit with good adhesion and no blistering. The circuitry and interconnects created were acceptable in every manner. The circuitry and interconnects were able to pass a 10 second, 288° C. solder shock test with good results. The adhesion of the circuitry to the surface of the imaged dielectric was determined to be 4 lbs/in and after said solder shock test the adhesion of the circuitry to the surface was still 3 lbs/in.

EXAMPLE III

Example I was repeated except that MacDermid Phoenix Non-Formaldehyde Electroless Copper (PH=8.5) was substituted for the MacDermid Electroless Nickel J-64 in the Electroless metallization of step 8.

The plating resulted in complete coverage of the surface by the electroless copper deposit with good adhesion and no blistering. The circuitry and interconnects created were acceptable in every manner. The circuitry and interconnects were able to pass a 10 second, 288° C. solder shock test with good results. The adhesion of the circuitry to the surface of the imaged dielectric was determined to be 4 lbs/in and after said solder shock test the adhesion of the circuitry to the surface was still 3 lbs/in.

What is claimed is:

1. A process for the metallization of a photoimageable dielectric surface, said process comprising contacting said surface with a metallization solution having a pH in the

|  | Time(min) | Temperature (°F.) |
| --- | --- | --- |
| 1). Solvent Swellant (MacDermid XD-6137, 10% by Volume | 4 | 145 |
| 2). Potassium Permanganate (MacDermid 9275,60 gr/e, 5% Na oH) | 4 | 165 |
| 3). Permanganate Reducer (MacDermid 9279, 10% by Volume) | 4 | 120 |
| 4). Alkaline Organo Silane Conditioner (MacDermid Conditioner 90) | 5 | 120 |
| 5). Activator Predip (MacDermid Activator Predip 93) | 1 | 80 |
| 6). Activator (MacDermid Activator 95) | 5 | 90 |
| 7). Accelerator (MacDermid Accelerator 97) | 2 | 120 |
| 8). Electroless Metallization (MacDermid Electroless Nickel J-64) PH = 9.0 | 8 | 90 |
| 9). Bake | 90 | 300 |
| 10). Electrolytic Copper (MacDermid 9241 Electrolytic Copper) | 5 | 75 |
| 11). Resist Application and Development |  |  |
| 12). Electrolytic Copper (MacDermid Electrolytic Copper) | 60 | 75 |
| 13). Electrolytic Tin (MacDermid Electrolytic Tin) | 10 | 75 |
| 14). Strip Resist (MacDermid Resist Stripper) | 5 | 110 |
| 15). Etch Exposed Copper (MacDermid Ultra Etch FL) | 2 | 110 |
| 16). Strip Tin (MacDermid Eliminator III Tin Stripper) | 2 | 100 |
| 17). Bake | 90 | 300 |

*Note: Clean water rinses were provided after each chemical operation.
*Note: These entire procedures may be repeated in order to build multilayer circuitry.

The above plating cycle resulted in complete coverage of the surface by the electroless nickel deposit with good adhesion and no blistering. The circuitry and interconnects created were acceptable in every manner. The circuitry and interconnects were able to pass a 10 second, 288° C. solder shock test with good results. The adhesion of circuitry to the surface of the imaged dielectric was determined to be 7 lbs/in and after said solder shock test the adhesion of the circuitry to the surface was still 5 lbs/in.

range of 3 to 12 such that a metal film is thereby deposited upon the photoimageable dielectric surface in an adherent fashion.

2. A process according to claim 1 wherein said metallization solution has a pH in the range of 4 to 11.

3. A process according to claim 1 wherein said metallization solution has a pH in the range of 5 to 10.

4. A process according to claim 1 wherein said process also comprises contacting said photoimageable dielectric surface with a conditioning agent comprising an organosilane prior to plating.

5. A process according to claim 2 wherein the metallization solution is selected from the group consisting of non-formaldehyde electroless copper, electroless nickel, and electroless cobalt.

6. A process according to claim 2 wherein the dielectric surface is baked after contacting said surface with said metallization solution.

7. A process according to claim 2 wherein the adhesion of the metal deposit produced on said photoimageable dielectric surface is in the range of 3 to 9 lbs/in.

8. A process according to claim 7 wherein the adhesion of the metal deposit produced to said photoimageable dielectric surface after solder shock for 10 seconds at 288° C. is in the range of 3 to 7 lbs/in.

9. A process for fabricating a circuitry package comprising:

(a) coating the surface of the substrate with a photoimageable dielectric material;

(b) exposing the coated substrate to an imagewise pattern of radiation, to which said photoimageable dielectric material is responsive, in an amount sufficient to at least partially cure the exposed areas of said dielectric;

(c) developing the coated substrate with a solution which will selectively remove non-exposed areas of the photoimageable dielectric thereby yielding substrate surfaces and photoimageable dielectric surfaces;

(d) optionally, further curing the photoimageable dielectric which remains on the surface;

(e) optionally, repeating steps (a) through (d);

(f) depositing a conductive material onto at least a portion of the photoimageable dielectric surfaces with a metallization solution having a pH in the range of 3 to 12;

(g) optionally, subsequently defining circuitry and interconnects by selectively etching portions of the conductive material; and (h) optionally, repeating steps (a) through (g) so as to build more than one layer of circuitry.

10. A process according to claim 9 wherein said metallization solution has a pH in the range of 4 to 11.

11. A process according to claim 9 wherein said metallization solution has a pH in the range of 5 to 10.

12. A process according to claim 9 wherein said process also comprises contacting said photoimageable dielectric surface with a conditioning agent comprising an organosilane prior to plating.

13. A process according to claim 10 wherein the metallization solution is selected from the group consisting of non-formaldehyde electroless copper, electroless nickel, and electroless cobalt.

14. A process according to claim 10 wherein the dielectric surface is baked after contacting said surface with said metallization solution.

* * * * *